United States Patent [19]
Weidenheimer et al.

[11] Patent Number: 6,154,477
[45] Date of Patent: Nov. 28, 2000

[54] ON-BOARD LASER-TRIGGERED MULTI-LAYER SEMICONDUCTOR POWER SWITCH

[75] Inventors: Douglas M. Weidenheimer, Brentwood, Calif.; Sol Schneider, Red Bank, N.J.; Jeffry Golden, Laurel, Md.

[73] Assignee: Berkeley Research Associates, Inc., Berkeley, Calif.

[21] Appl. No.: 09/076,110

[22] Filed: May 12, 1998

Related U.S. Application Data

[60] Provisional application No. 60/046,404, May 13, 1997.

[51] Int. Cl.[7] .............................. H01L 29/74; H01S 3/30; H01S 5/00
[52] U.S. Cl. .................................. 372/50; 372/8; 257/113
[58] Field of Search .......................... 372/8, 50; 257/113

[56] References Cited

U.S. PATENT DOCUMENTS

| | | |
|---|---|---|
| 3,663,838 | 5/1972 | Reimers . |
| 4,016,592 | 4/1977 | Yatsuo et al. .............................. 357/38 |
| 4,047,219 | 9/1977 | Temple . |
| 4,053,922 | 10/1977 | Ferro . |
| 4,060,826 | 11/1977 | Voss . |
| 4,100,562 | 7/1978 | Sugawara et al. . |
| 4,131,905 | 12/1978 | Hanes et al. .............................. 357/38 |
| 4,186,409 | 1/1980 | McMullin .................................. 357/38 |
| 4,368,481 | 1/1983 | Ohashi et al. ............................. 357/30 |
| 4,500,164 | 2/1985 | Kiyohara ................................. 350/96.1 |
| 4,561,096 | 12/1985 | Namizaki et al. . |
| 4,757,367 | 7/1988 | Konishi et al. . |
| 4,779,126 | 10/1988 | Herman .................................... 357/38 |
| 4,812,892 | 3/1989 | Voss . |
| 4,829,357 | 5/1989 | Kasahara . |
| 4,864,168 | 9/1989 | Kasahara et al. . |
| 4,866,500 | 9/1989 | Nishizawa et al. . |
| 4,974,047 | 11/1990 | Niwayama . |
| 4,975,755 | 12/1990 | Nishizawa . |
| 5,003,192 | 3/1991 | Beigel . |
| 5,017,991 | 5/1991 | Nishizawa et al. . |
| 5,121,401 | 6/1992 | Dahl . |
| 5,138,415 | 8/1992 | Yano . |
| 5,206,540 | 4/1993 | De Sa e Silva et al. . |
| 5,258,670 | 11/1993 | Baba et al. . |
| 5,349,599 | 9/1994 | Larkins . |
| 5,646,760 | 7/1997 | Kuijk et al. . |
| 5,663,580 | 9/1997 | Harris et al. . |
| 5,672,917 | 9/1997 | Nakano . |
| 5,677,552 | 10/1997 | Ogura . |

OTHER PUBLICATIONS

Victor A.K. Temple et al., "High–Power Dual Amplifying Gate Light Triggered Thyristors", *IEEE Transactions on Electron Devices*, vol. ED–23, No. 8, Aug., 1976, pp. 893–898.

(List continued on next page.)

*Primary Examiner*—Frank G. Font
*Assistant Examiner*—Armando Rodriguez

[57] ABSTRACT

A laser activated semiconductor switching device has a semiconductor structure housed in a semiconductor structure housing, and a laser array assembly directly connected to the semiconductor structure housing. The laser array assembly houses a plurality of laser diodes and diode control circuitry which energizes the laser diodes to emit light directly onto a surface of the semiconductor structure, which can be the cathode or anode surface, to cause the semiconductor structure to generate current carriers which enable passage of current through the semiconductor structure. The device can further include a second laser array assembly which is connected to the side of the semiconductor structure housing opposite to that on which the first laser array assembly is connected, and is configured to operate in a manner similar to the first laser array assembly. The surfaces of the semiconductor structure can be covered with metal layers having openings which permit the passage of the laser light into the semiconductor structure. The metal layers are reflective to the laser light and prevent the laser light that has passed into the semiconductor structure from exiting the structure to improve current carrier generation.

28 Claims, 3 Drawing Sheets

OTHER PUBLICATIONS

Dieter Silber et al., "Progress in Light Activated Power Thyristors", *IEEE Transactions on Electron Devices,* vol. ED–23, No. 8, Aug., 1976, pp. 899–904.

L.R. Lowry, *Optically Activated Switch,* Aprl., 1978, cover thru p. 295.

Victor A.K. Temple et al., *Light–Triggered Thyristors for Electric Power Systems,* Nov., 1978, cover thru p. 4–11.

Andre A. Jaecklin, "Turn–on Phenomena in Optically and Electrically Fired Thyristors", *IEEE Transactions on Electron Devices,* vol. ED–29, No. 10, Oct., 1982, pp. 1552–1559.

Andre A. Jaecklin, "Two–Dimensional Model of a Thyristor Turn–On Channel", *IEEE Transactions on Electron Devices,* vol. ED–29, No. 10, Oct., 1982 pp. 1529–1535.

L.O. Eriksson et al., "A Light Triggered Pilot Thyristor For High Voltage Applications", *Satech '86,* cover thru p. 12.

A. Rosen et al., *Optically Activated Pin Diode Switch*,* 1988, cover thru p. 2–30.

I.L. Somos et al. Plasma Spreading Loss in 100mm Thyristors, *Power Conversion Intelligent Motion,* Jun., 1988, pp. 1–4.

H.H. Glascock II et al., *Advanced Packages for Power Devices,* Jun., 1990, cover thru p. 33.

S. Levy et al., *Commerical Applications for Modulators and Pulse Power Technology,* 1991, pp. 1–20.

Jian H. Zhao et al., Dynamic I–V Characteristic of an AlGaAs/GaAs–Based Optothyristor for Pulsed Power–Switching Applications, *IEEE Electron Device Letters,* vol. 13, No. 3, Mar. 1992, pp. 161–163.

Jian H. Zhao et al., "An InP–Based Optothyristor for Pulsed Power–Switching Applications", *IEEE Electron Device Letters,* vol. 14, No. 3, Mar. 1993, pp. 140–142.

ON-BOARD LASER-TRIGGERED MULTI-LAYER SEMICONDUCTOR POWER SWITCH

RELATED APPLICATION

This application claims the benefit of U.S. application Ser. No. 60/046,404, filed May 13, 1997.

FIELD OF THE INVENTION

The present invention relates to a semiconductor power switch controlled by a laser array. More particularly, the present invention relates to a 4-layer semiconductor power switch, such as a thyristor, to which is mounted a laser diode array assembly controllable to introduce photons into the active region of the semiconductor switch and activate the switch for permitting current to pass therethrough.

BACKGROUND OF THE INVENTION

Semiconductor switching devices, such as transistors, diodes, MOSFETs and thyristors, are well known in the art. These devices have a semiconductor structure, such as silicon, GaAs and the like, having regions or layers with implanted dopants (impurities) at density levels determined by the type of semiconductor device and its desired application. The type of dopant implanted dictates whether the doped layer is a positively doped layer (a p-layer) or a negatively doped layer (an n-layer). The number and arrangement of layers varies depending on the type of device.

For example, a semiconductor diode includes adjacent p and n layers, an n-p-n semiconductor transistor includes a single p-layer sandwiched between two n-layers, and a p-n-p transistor includes a single n-layer sandwiched between two p-layers. A thyristor, on the other hand, is a 4-layer semiconductor structure with alternate n and p layers arranged in the order n-p-n-p. Thyristors are commonly used as high power switching devices which are capable of operating in high current environments.

To configure a thyristor as a high power switching device, the n-p-n-p layer semiconductor structure is fabricated using any known techniques. Metal layers are then attached to opposite sides of the structure by, for example, sputtering, vacuum-film deposition, or any other known process. Hence, the metal layer attached to the n-layer side functions as a cathode electrode of the device, while the metal layer attached to the p-layer side functions as an anode electrode. Gate structures, which control the activation of the switch, are also formed, for example, on the cathode side of the device.

The device including the anode electrode, cathode electrode and gate structures can then be mounted in a suitable housing, such as an insulative housing having anode and cathode terminals which are coupled to the anode electrode and cathode electrode, respectively, of the device. The housing also includes gating terminals which are coupled to the gate structures of the device.

The assembled power switching device can then be employed, for example, as a switch that is controlled to regulate high ampere current being provided to a load. In this type of application, the cathode or anode of the power switching device can be coupled to a power supply, and the anode or cathode can be coupled to the load. When a control voltage is applied to the gate terminal, current carriers (i.e., electron-hole pairs) are generated in the semiconductor structure which initiates regenerative carrier production by the 2 transistor model for this class of device. This permits current provided by the power supply to flow through the switch to the load. After the control current is removed from the gate terminal, and the load current falls below some critical value (holding current), generation of current carriers ceases, and the device recovers to its "off state" in which the center p-n junction is reversed biased and prevents passage of current from the power supply to the load.

Several problems exist with power switching circuits of this type which employ conventional gate structures. In particular, the gating structures typically occupy as much as 45% of the area of the cathode surface of the device. Because load current must flow through the actual cathode electrode/semiconductor contact area, load current is forced to redistribute around the area of gate and cathode contacts at the cathode surface. Because ohmic heating limits the current density in the semiconductor, the amount of current that the device can accommodate is significantly limited by the gating structure. Accordingly, the area of the semiconductor structure must be made larger to accommodate higher current levels, thus increasing the overall size of the switch. However there is a practical limit to the size of semiconductor wafers that can be manufactured, typically a diameter of less than 155 mm. Thus, these 4 layer switches have limited current carrying capability.

Furthermore, the redistribution of current flowing through the device around the gate regions creates non-uniform current distributions in the device such as current filaments. These non-uniform current distributions increase the probability of thermal runaway, which can shorten the lifespan of the device because of localized heating and damage.

Also, in semiconductor switches having conventional gate structures, a plasma spreading phenomenon occurs from the gate attachments to the p-type base semiconductor structure, which limits the rate of rise of current (di/dt) through the device. Although more complicated gate geometries have been developed which minimize the adverse affect of the plasma spreading phenomenon, such complicated gate structures increase the overall complexity of the device.

In extreme applications (e.g., high di/dt, high current, high charge transfer), the conventional gate structures also suffer from a high incidence of failure. For example, in the n-p-n-p structure described above, gate structures are applied to portions of the p-type base structure which has been "pulled up" through the n-layer cathode surface of the structure. This arrangement creates adjacent areas in the semiconductor structure which are electrically isolated from each other. When a large amount of drive current is applied to the gates, transient potential differences can exist between the gates and the cathode surface adjacent the gates. This difference in potential can create surface discharges in the structure which eventually short the adjacent electrically isolated areas together and render the device inoperable.

To overcome the problems associated with conventional gated power switching devices, a laser activated silicon switch is described in a publication by L. R. Lowrey entitled "Optically Activated Switch", Westinghouse Research and Development Center, Pittsburgh, Pa., April 1978. The laser activated silicon switch employs a laser, such as a high power Nd-YAG laser, which operates as the gating device in place of a conventional gating structure. This laser emits laser light which is absorbed by the semiconductor structure of the type described above. The absorbed laser light (photons) excites the semiconductor structure to generate electron-hole pair current carriers, which permit current to flow through the semiconductor structure. Hence, the switch is controlled to operate in active and inactive modes by controlling the laser.

Another type of laser activated switch is described in a publication by A. Rosen and P. J. Stabile entitled "Targetted Applications for Laser Activated Switching", David Sarnoff Research Center, Princeton, N.J. This type of laser activated switch includes a plurality of PIN diode arrays which are connected in series to receive electrical input signals. A laser array is positioned above the PIN diode arrays to irradiate light that is absorbed by the semiconductor structures of the PIN diodes. The absorbed light causes the semiconductor structures to generate current carriers (electron-hole pairs) which allow current to flow through the diodes. Hence, the laser array is controlled to control the flow of the electrical input signals through the diode arrays.

Other types of laser activated switches are described is U.S. Pat. Nos. 5,017,991, 4,974,047, 4,779,126, 4,500,164, 4,368,481 and 4,016,592. However, these devices are unsuitable for high di/dt applications.

Although laser activated switches are known in the art as demonstrated above, a continuing need exists for improved laser activated semiconductor switches. For example, a need exists for a laser activated semiconductor switching device having a semiconductor structure and laser array which are packaged together as a single unit, to therefore reduce the size of the device. A continuing need also exists for a laser activated semiconductor switching device capable of handling very high current and a very high rate of current rise, so that the switching device can be employed as a high power switching device. It is also desirable for the switching device to have improved current flow efficiency and low failure rate.

SUMMARY OF THE INVENTION

An object of the present invention, therefore, is to provide a laser activated semiconductor switching device having at least one laser array housing that is mounted directly to the housing of the semiconductor structure, so that the laser light, such as generated by a semiconductor diode laser or a bar laser array, is emitted directly onto at least one surface of the semiconductor structure.

A further object of the present invention is to provide an efficiently packaged laser activated n-p-n-p power thyristor capable of operating under high current conditions.

Another object of the present invention is to provide a laser activated semiconductor switching device having a semiconductor structure in which all but a nominal amount of area of the anode electrode and cathode electrode surfaces is used for current flow through the device.

A still further object of the invention is to provide a laser activated semiconductor switching device capable of operating under high current and high current rate of rise applications.

Another object of the invention is to provide a laser activated semiconductor switching device in which the diode laser wavelength is optimized to generate current carriers with high efficiency in response to the photon energy absorbed by the semiconductor structure.

These objects of the present invention are achieved by providing a laser activated semiconductor switching device comprising a multilayer semiconductor structure and a laser or laser array. The semiconductor structure can be an n-p-n-p structure, and is housed in a semiconductor structure housing. The laser array includes a plurality of laser diodes or bar laser arrays which are housed in a laser array housing. The laser array housing is mounted to the semiconductor structure housing such that the laser diodes or bar laser arrays can emit light directly onto a surface of the semiconductor structure, which can be the cathode or anode surface.

The switching device can further include a second laser array housed in a second laser array housing which is mounted to the side of the semiconductor structure housing opposite to that on which the other laser array housing is mounted. Each of the laser array housings can include laser control circuitry for controlling energization of its respective laser array. Also, each of the laser array housings can be conductive and therefore, function to conduct load current through the semiconductor structure.

The anode and cathode surfaces of the semiconductor structure each are polished and metallized with a metal layer that is reflective to the laser light. Each metal layer includes a plurality of slits, which expose a nominal portion of the entire area of the anode or cathode surface to which the metal electrode layer is applied. Each of the laser array housings include slits which substantially align with the slits in the metal layer on their respective surface of the semiconductor structure. The slits in the metal layers may also comprise areas of very thin metal through which the laser light can pass with only modest attenuation.

Each laser diode emits light which passes into the semiconductor structure through a respective slit in the housing and metal layer. The photons in the laser light excite the semiconductor structure to cause the semiconductor structure to generate current carriers (electron-hole pairs). Furthermore, the photons attempting to exit the semiconductor structure are reflected back into the semiconductor structure by the metal layers on the surfaces of the semiconductor structure, which improves the efficiency at which the current carriers are generated. High current can therefore pass through the semiconductor switching device at high efficiency.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE INVENTION

Figure 1:
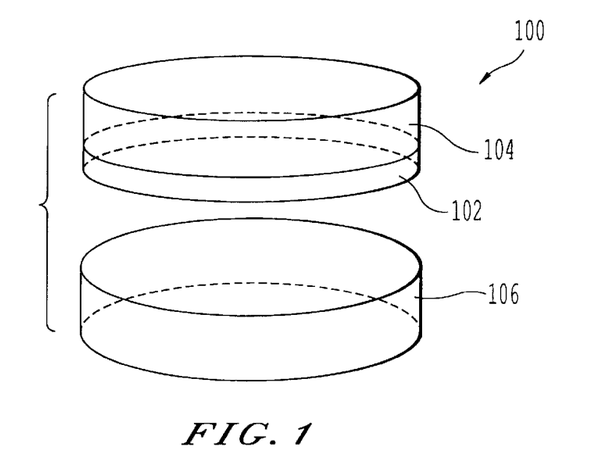
FIG. 1 is a schematic exploded, perspective view of an on-board laser triggered 4-layer semiconductor power switch assembly according to an embodiment of the present invention.
Figure 2:
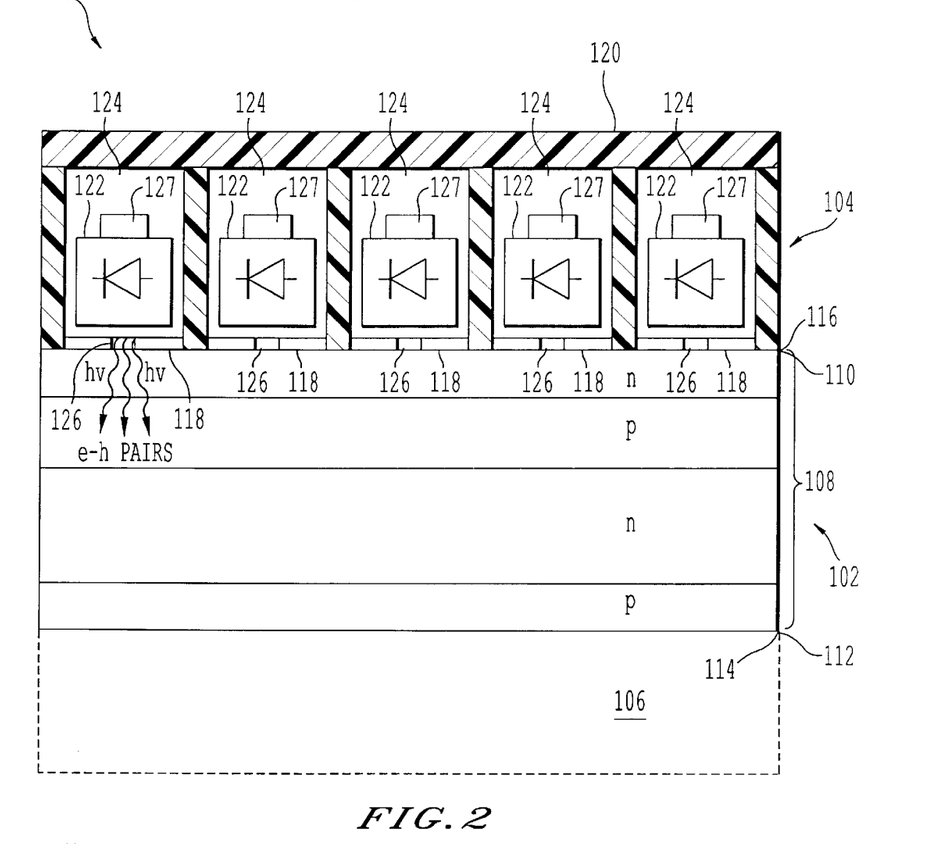
FIG. 2 is a schematic side elevational view in cross section of the power switch assembly shown in FIG. 1.

FIGS. 1 and 2 schematically illustrate an example of an on-board laser triggered 4-layer semiconductor power switch assembly 100 according to an embodiment of the present invention. The switch assembly 100 includes a switching structure 102, a laser array housing 104, and a second optional laser array housing 106.

As shown in FIG. 2, the switching structure 102 includes an active silicon planar wafer 108 which, in this example, is a 4-layer structure (n-p-n-p) fabricated by any of the known processes available for planar devices. The density of the dopants (impurities) in the structure is determined by the specific application in which the switch assembly 100 is to be used. Parameters such as forward and reverse blocking voltage, recovery time and forward on-state voltage drop determine the actual impurity density for the distinct layers of the switching structure 102.

Devices with multilayer semiconductor structures other than a 4-layer structure can also be improved by light activation with one or more on-board lasers. Examples are the 2-layer p-i-n diode and the p-i-n diode. Another is the three layer transistor—either pnp or npn. Naturally, the structure can also have any number of layers in excess of four, such as 5-layer structure, 6-layer structure, and so on.

Also, the wafer 108 need not be silicon, but can be made from indirect band gap materials such as germanium and silicon carbide, or from direct bandgap materials such as gallium arsenide and gallium nitride. The thickness of the active silicon wafer 108 is about 200 micrometers per kilovolt of forward blocking voltage. Furthermore, the edges of the wafer 108 are passivated by any common preparation techniques for these devices.

One layer of the switching structure 102 is configured to function as a cathode 110 of the switch assembly 100, while the layer on the opposite of the switching structure 102 is configured to function as an anode 112 of the switch assembly 100. The cathode layer 110 may contain "shorts" as known in the art (i.e., metal posts extending through the first n layer into the adjacent p layer to short out the capacitance of the p-n junction) for the purpose of modifying the sensitivity of the device to self-triggering due to applied dv/dt (voltage rate of rise).

Electrical contacts, also called electrodes 114 and 116 are formed on the anode 112 and cathode 110, respectively. The electrical contacts 114 and 116 are formed by a metal layer applied to the wafer 108 by vacuum deposition or any other suitable method. These contact layers 114 and 116 are in intimate contact with the silicon wafer 108 so that the full electrical conduction area is realized. Both surfaces of the silicon wafer must be polished and then metallized with contacts 114 and 116 for high reflectivity at the laser wavelength. The high reflectivity causes scattered or transmitted photons to be confined and efficiently utilized within the semiconductor volume. Consequently, the polishing may require optical precision. Choices of metals for the electrical contacts 114 and 116 include, but are not limited to, aluminum, gold, silver or copper, all of which have good reflectivity for the applicable range of photon wavelengths.

The metallized contacts 114 and 116 are formed continuously on their respective surfaces 110 and 112, respectively, except for in the areas of the laser light entrance slits 118. These slit areas 118 are masked off during fabrication, so that apertures result through which the laser light can be introduced into the semiconductor wafer 108 as described below. The aperture of the slits may also have a very thin layer of metal applied to the semiconductor surface, but it must be sufficiently thin so that the attenuation of the laser light is modest. An index matching coating and/or glass or semiconductor structure (not shown) can be applied at these slits 118 for reducing unwanted reflection and refraction, and for enhancing the transmission of the light into the silicon. In cases when only one surface of the semiconductor switching structure 102 mates with a laser array housing (e.g., housing 104 or 106), the metallization at the opposite surface of the wafer 108 is continuous. The metallization and electrodes thereby formed may have an extent that is less than the full diameter or lateral extent of the anode or cathode semiconductor layers for the purpose of increasing the voltage blocking and withstand voltage of the switch.

As described above, the switching structure 102 is typically "gateless", meaning that it does not include a cathode surface gate structure present on conventional electrically triggered 4-layer switches. The slits 118 in the metallization constitute no more than a few percent (e.g., less than about 2%) of the area of the planar wafer 108.

However, a small gate structure (not shown), similar to a conventional gate structure, may be manufactured on the wafer 108 so that the switch assembly 100 may be operated in either conventional electrically triggered mode or in the photonically triggered mode described below. Said conventional electrical gate structure may be either a pilot gate or a distributed structure. The two kinds of triggering may be used together to effect a faster or more uniform triggering, or to provide triggering redundancy.

Also, the wafer 108 can have variations in layer thickness to provide for higher voltage blocking capability and/or to match the range of the photons in the semiconductor material. Otherwise, the 4-layer structure of the wafer 108 is basically the same or similar as those electrically gated.

Figure 3:
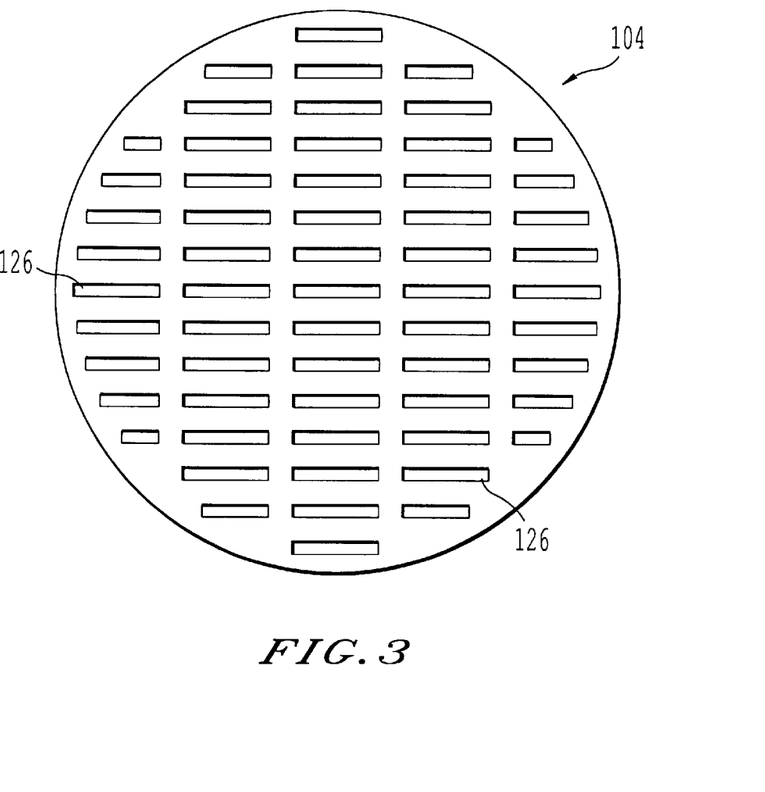
FIG. 3 is a top plan view of the emitting surface of the laser array housing assembly of the power switch assembly shown in FIG. 1.
Figure 4:
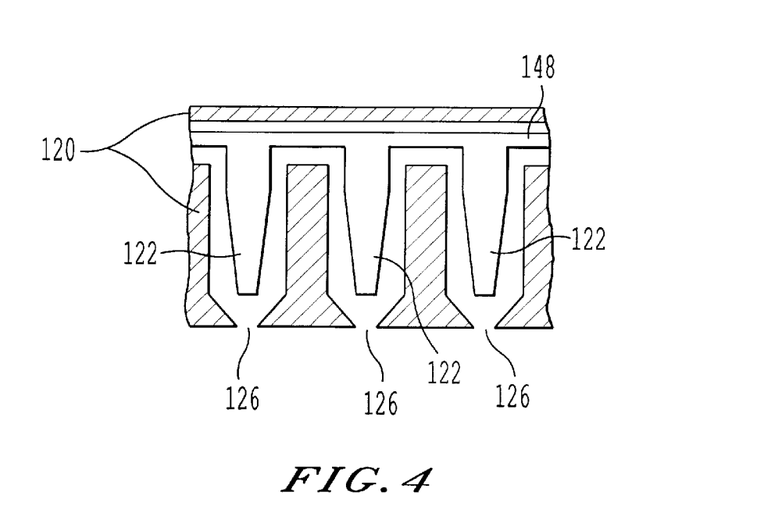
FIG. 4 is a schematic, enlarged side elevational view in cross section of the laser array housing of the power switch assembly shown in FIG. 1.

The laser array housing 104 is shown in more detail in FIGS. 2–4. Because laser array housing 106 is essentially identical to laser array housing 104, only laser array housing 104 will be discussed to avoid redundancy.

The laser array housing 104 mates with the 4-layer structure on the cathode 110 side. Alternatively, laser array housing 106, which has a structure essentially identical to laser array housing 104, can mate on the anode 112 side. Also, both laser array housings 104 and 106 can be mounted to their respective sides of the semiconductor housing 102.

The laser array housing 104 includes a conductive housing 120 which is made from a conductive material for the purpose of conducting load current and heat, and for protecting the lasers 122 (e.g., in the form of laser bars each including 10 to 100 individual laser diodes) from mechanical forces and stresses from high electromagnetic (E-M) fields that are present during the operation of the switch assembly 100. Preferred materials for the housing include those with high strength under compression, high electrical and heat conductivity, high heat capacity and manageable temperature coefficient of expansion with respect to silicon. The best candidates are the refractory metal/copper alloys, molybdenum alloys and copper/ceramic composites like glid-copper. The housing gives up no more than 50% of its cross section normal to the axis of conduction to lasers 122 and circuit components (described below), thereby preserving a high electrical and thermal conductance for the switch assembly.

The lasers (e.g., laser bars) 122 each or multiply reside in cells 124 within the housing 104 and may be double shielded for protection from the high E-M fields present in or near the switch. Their final positioning, angle and packing fraction is determined on a case-by-case basis, using the criteria discussed below.

The mating/output surface of the housing 104 is perforated with a pattern of slits 126 that correspond to the slits 116 in the surface metal layer 116 of the wafer 108. A typical slit 126 has a width on the order of 100–200 microns, but can vary depending on the application desired. The length of each of the slits 126 matches the length of the individual lasers 122. (e.g., 1 cm. nom.). Setback of the lasers 122 from the surface also varies with the desired application, and is nominally dependent on index matching between the laser arrays and the active switch surface.

The cells 124 within the housing are angled to match the orientation of the lasers 122. Positioning of the cells 124, lasers 122 and slits 126 varies with the type of application desired, but the typical packing density is between 1 and 4 laser bars/cells per sq. cm. (assuming 10–50 Watts laser/bar).

Typically, the lasers 122 can be AlInGaAsP or InGaAsP diode lasers, and require approximately 1 ampere of electrical drive current per watt of optical output power. At a forward voltage drop of less than 2 volts, the laser efficiency is nominally 50%. Because the expected quantum efficiency can be near 100% for conversion of photons into charge carriers, the overall triggering efficiency is typically at least 50% of the purely electrical gating, in terms of initial carrier production. However, this is not an appropriate figure of merit for comparing photonic and electrical triggering, details of which are described later in the text.

All of the power conditioning components (switches, capacitors, resistors, buswork, and so on described below) can be contained within the laser array housing 104. The lasers 122 are placed in series/parallel combinations so as to best match their drive requirements to the available circuit components for each application.

The lasers 122 exhibit some temperature dependent wavelength characteristics. In the preliminary range of interest (0 to 100° C. for silicon semiconductor), the laser diodes 122 seem to have a positive temperature coefficient of wavelength that is about 3° C. to about 4° C. per nm. In the laboratory, this characteristic may be used to "fine tune" the wavelength for a particular application. When implementing the switch for fieldable systems, unwanted heating of the laser diode arrays needs to be minimized, or at least controlled. The thermal characteristics of the housing 104 can be exploited for sinking heat from the lasers 122, as well as from the active silicon wafer 108.

For the semiconductor material, such as silicon carbide, which may be operated at high temperatures, such as 200° C. or higher, the laser housing may be separately cooled by external fluid or by Peltier or thermoelectric cooling devices 127. These thermal devices may be used to adjust the laser output wavelength to optimize carrier generation. They may be externally powered or they may be "slaved" to the applied power supply potential (discussed below).

The temperature adjustment capability also permits the wavelength to be matched to a particular depth of penetration of the photons in the semiconductor structure. This can improve switch operation as the depletion region thickness varies with the applied voltage. This provides control of carrier density in both the n and p base depletion layers because the photons can penetrate into both bases, i.e., the intermediate layers of the 4-layer structure.

For a totally isolated application where the laser power is slaved to the main energy source as discussed below, the lasers 122 are activated by a low power optical pulse. As further discussed below, the optical pulse activates a pin or avalanche photodiode to gate a thyristor, transistor, MOSFET or other low power semiconductor switches, or their optically triggered hybrids, to discharge a capacitance through the laser circuit. In applications where isolation is not a concern, the laser power can be supplied externally through charging of on-board capacitors. The lasers 122 may also be driven by an external high current electrical source.

FIG. 3 schematically illustrates the emitter plane of the laser array housing 104, and FIG. 4 is a cross-sectional schematic of a cell 124. As discussed above, the emitting surface of the laser array housing 104 has a pattern of slits 126 through which the photons emitted by the lasers 122 pass. The specific pattern of slits 126, and therefore, the layout of the lasers 122 within the structure depends on the application in which the switch assembly 100 is used. The slits 126 are an extension of cells 124 that are milled into the housing 104 for mounting the lasers 122. Slit width can be as narrow as 100 micrometers (a laser emitter width is 1 micrometer), and is determined by the "stand-off" of the lasers 122 from the silicon surface 108 and the divergence angle for the particular combination of laser and index matching medium.

Available diode laser bar array technology constrains the geometry and light intensity and brightness of the trigger laser array. The total width of each bar array is nominally less than 500 microns. Depending on the application, spatially averaged laser power densities in the semiconductor structure 104 range from 10 to 200 watts/sq. cm. Because the actual photon source width is on the order of 1 micron, the power density at the slits 118 in the metallized terminal of the wafer 108 can be as high as $5\times10^3$ watts/cm². The emitter depth is typically on the order of 20 microns, so the carrier density can reach anywhere from about $10^{19}$ to about $10^{20}$ e-h prs./cm³ in this region. Consideration has to be given to the onset of free carrier absorption, which amounts to about 10% of the photons at about $10^{20}$ e-h prs./cm³, and may require a modification to the setback or angle of the lasers with respect to the normal. In any case, the arrangement provides sufficient carriers present in the silicon volume, downstream of the slits 118 in the surface metallization, to create a highly conductive region in this area. This serves to re-distribute the current in the emitter layer and makes the slits 118 practically non-perturbing to the current flow pattern when the active volume is conducting load current.

The surface of the housing 120 opposite from the emitting surface is a solid or substantially solid conductor. The housing 120 is designed to withstand a clamping force of several thousand lb./in² that may be applied to the switch assembly. Also, the housing 120 is configured for connection to resistive divider and trigger circuits (electrical or optical) as discussed below. Outside edges of the housing 120 may be tapered, radiused or chamfered to reduce electrical field stresses in the assembly. The housing may be integrated with any common packaging techniques used for high current thyristors such as the "hockey puck" package or molded flat pack. This geometry is expected to vary dependent on the application and is coordinated with the silicon wafer design.

The conductive housing 120 for the laser arrays is in intimate contact with the surface metallization 116 on the 4-layer silicon wafer 108. Clamping force is applied externally and can be up to several thousand lb./in². Because the laser array housing 120 carries load current, it is important that good contact is made between the housing 120 and the silicon wafer 108.

The housing 120 also may be plated or metallized with a suitable highly conductive metal for this purpose. A diffusion bond may be formed between the housing 120 and the wafer in this way. However, consideration must be given to the matching of thermal expansion coefficients between the materials used for this assembly. Silicon has a rather low thermal expansion coefficient ($2.7 \times 10^{-6}/°$ C.), which is lower than most metals that are suitable for construction of the array housing. Therefore, the housing 122 surface may have a tendency to move in relation to the silicon wafer 108 surface as the temperature of the assembly 108 changes. Hence, the choice of materials and design should minimize and/or mitigate the effect of this movement. Also, the mating surface of the housing 120 should be lapped for flatness, so that it does not disturb the optical properties of the finished silicon wafer 108.

Although laser triggering may be used on small diameter devices, the arrangement described above is most practical for planar switch diameters that are approximately equal to 1 inch or greater. In such larger switches, photonic triggering may be the only practical way to efficiently utilized the large wafer cross-sectional area for conduction. The upper limit is determined by the planar silicon fabrication limits. Wafer 108 thickness of up to 3.5 mm are also accommodated and are limited only by the depth to which photons can penetrate the material. Although not shown, the outer diameters of the pieces of the assembly 100 have radiused edges for lowering electric field stress at any triple points formed by the package. Also, the metal electrodes may be of less extent than the semiconductor so as to leave an edge region, such as an annulus without metallization so that the electric field at the edge is further reduced. As described above, passivation techniques and electrode and semiconductor shaping are used to suppress surface breakdown around the outer diameter of the silicon material.

In a higher voltage application, requiring more than one device, a stack of switch assemblies 100 is made and clamped together to act as a single switch. Laser arrays assemblies (e.g., laser assemblies 104 and 106) can be mounted to all cathode and/or anode terminals, and may also be staggered from switch to switch in the series stack. In such a configuration, the number of dissimilar mating surfaces is halved for the assembly.

Figure 5:
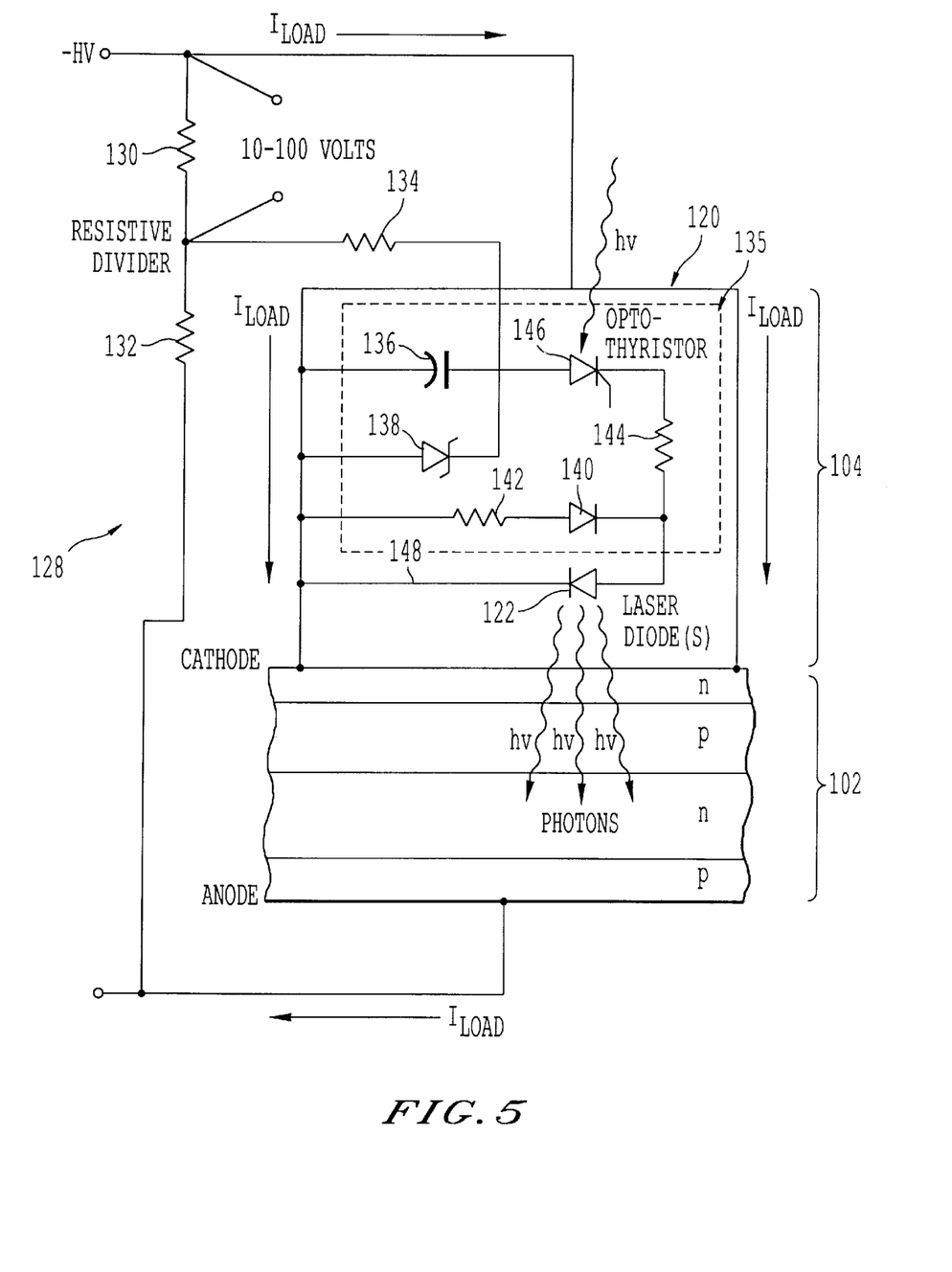
FIG. 5 is a schematic diagram of the circuit for driving the lasers in the power switch assembly shown in FIG. 1.

A typical on-board laser drive circuit 128 is shown schematically in FIG. 5. The circuit 128 includes a resistor divider comprising resistors 130 and 132 which are coupled in series with each other across a load HV, and a resistor 134 having one terminal coupled to the connection point between resistors 130 and 132. The circuit 128 further includes a laser driving circuit 135 including capacitor 136, zener diode 138, diode 140, resistors 142 and 144, and optothyristor 146 connected as shown. Capacitor 136, zener diode 138, diode 140, resistors 142 and 144, and optothyristor 146 are housed in the housing 120 in which the lasers 122 that the circuit driver are also housed.

Energy for driving the lasers is stored in capacitor 136. The capacitor 136 should be rated at from about 10 to about 100 volts, depending on the type of application in which they are being used. Voltage is regulated across the capacitor 136 by a zener diode 138. Energy to charge the capacitor 136 is obtained from the resistive voltage divider circuit. This divider circuit is across the switch assembly 100 and external to the switch assembly 100 as shown. The capacitor charge is referenced to the terminal of the switch where the arrays of lasers 122 are located. In applications where laser array assemblies 104 and 106 are applied to both surfaces of the structure 108, opposite ends of the same divider are used so that each array is referenced to its respective terminal.

Furthermore, the buswork 148 connecting the lasers 122 is designed for low inductance series/parallel configurations. The circuit 128 also must be sufficiently damped to prevent voltage reversal across the lasers 122. A combination of resistance in series with the laser and a clamping diode/series resistor are included for this purpose. The discharging switch is either a photodiode triggered thyristor, optothyristor or other semiconductor switch. The laser diode circuit element may actually be a series of laser diode arrays. Series operation of multiple diode arrays reduces the number of discharge switches required for a specific application.

Also, one laser driving circuit 135 can be used to drive all of the lasers 122 in the laser array assembly 104. Alternatively, a plurality of laser driving circuits 135 can be used with each laser driving circuit 135 driving a respective plurality of lasers 122. All lasers 122 should be driven simultaneously or substantially simultaneously.

As stated above, laser array housings 104 and 106 can be mated to both the cathode 110 and the anode 112 surfaces, respectively. This type of arrangement can be used in an application requiring more laser power than can be packaged in one laser array housing alone. Also, the pattern of the slits 118 in the housings 104 and 106 can even be staggered between the two surfaces to achieve more uniform illumination. Two housings may also be employed for the purpose of "bias" illuminating the active silicon. In this application, one array is operated at a low power level, for the purpose of generating a few carriers in the active volume before the main trigger, optical or electrical, is applied.

The switch assembly 100 is activated by the generation of charge carriers by photon interactions with the semiconductor material of the wafer 108. Consequently, photon transport and absorption in the semiconductor are important phenomena in the design of the device. The photons generated by the lasers 122 are absorbed in the semiconductor material of the wafer 108, and the laser light is attenuated according to the characteristic absorption length for the specific wavelength of laser emission. The characteristic wavelength for laser emission is chosen so that the photon energy exceeds the band gap energy in the semiconductor material. Thus, for a selected wavelength and given amount of emitted laser light intensity, there is an optimum useful semiconductor layer thickness.

Accordingly, the maximum layer thickness determine the thickness of the 4-layer structure and also the blocking voltage of the switch. The range of wavelengths relevant to this application for a silicon semiconductor structure is from about 980 nm to about 1090 nm. For example, one commercially available laser bar array provides laser light at a wavelength of 1085 nm. The absorption length (1/e where "e" is the base of the natural logarithm) in silicon ranges from about 0.125 mm to about 2.5 mm over this relevant range of wavelengths. Multiple reflections are desired so that the photons illuminate the entire wafer volume and produce photoconductivity throughout the switch. Therefore, the absorption length must be greater than the thickness of the device, for optimum operation.

The orientation angle of the lasers 122 with respect to the normal has practical limitations. Because the output divergence of the laser diodes is typically +/−10 to 40 degrees (dependent on index of refraction of the coupling medium) in a plane that is normal to the plane of the diode junction emitters, there will be a range of incident angles on the silicon for any given laser orientation. Angles of orientation are best limited to less than 30 degrees from the normal. The relatively high index of refraction of silicon, approximately 3.5 at these wavelengths, may necessitate index-matching for efficient photon use. If index matching is employed between the laser material and the silicon wafer 108, the magnitude and angle of the transmitted light can be controlled. These parameters ultimately affect the uniformity of illumination of the interior of the semiconductor structure.

In a design for a specific application, the laser divergence, orientation angle, polarization and index-matching material (if any) can be adjusted to maximize the magnitude and uniformity of the laser light in the silicon wafer. The photons produce electron-hole pairs (e-h pr) as they are absorbed, with a quantum efficiency very near 100%, for these wavelengths in silicon.

All of the photocarriers generated in the silicon volume do not contribute equally to the triggering action and to the consequent "latch-on" of the switch assembly 108. The photons that are absorbed in the depletion regions and within a diffusion length of these regions, surrounding the blocking junction, provide the primary triggering mechanism for this kind of switch. A "diffusion length" is defined as the mean distance that an e-h pair travels before recombining. This distance is approximately inversely proportional to the dopant concentration, and it is directly proportional to the carrier lifetime, in the silicon. Therefore, it follows that the diffusion length in the n-base is longer than that for the p-base. Because the photonic triggering scheme generates e-h pairs in both base regions simultaneously, it is ultimately a superior method for triggering this class of switch. Subtle differences in triggering characteristics, because of the absorption gradient in the silicon, can be exploited by application of this trigger from either the cathode or anode terminal, and, by adjusting the laser wavelength for the particular application.

Photo-activated switching proceeds in the following manner. The rate of current rise (di/dt) is initially controlled by the laser light generated photo-conductivity. During the period of time before carrier regeneration begins, the di/dt capability of this switch depends on the rate of photo-generation of electron-hole pairs. It is desirable to balance the carrier requirement for the di/dt of a specific application with the photo-generated carrier density. For a given di/dt and photon fluence in the silicon, the carrier requirement increases as $t^2$ and the photocarriers are increasing as $t^1$. Therefore, the regenerative carrier build-up needs to be established before the photo-carriers run out. The time for this process to begin is typically on the order of a few microseconds. These considerations are in contrast to those for the electrically triggered version which is almost totally dependent on horizontal and vertical plasma spreading (diffusion or propagation) for its di/dt capability.

Assuming that there is some forward voltage bias present across the switch, there is a depletion region formed on both sides of the blocking junction. Photo-generated e-h pairs that are present in the depletion regions, and those within a diffusion length of these regions, are the active carriers for this switch. The high electric fields in these depletion regions accelerate the e-h pairs toward the blocking junction where they are separated into electrons and holes and subsequently move toward the anode and cathode terminals respectively. This movement of carriers toward and then across the common base junction starts a regenerative process by which more carriers are produced by the action of the "2 transistor model" for this kind of switch. When the regenerative action is established, the current through the switch and its rate of rise (di/dt) is determined by the regenerative process rather than solely by photon-induced carrier fluence.

The maximum conduction current through the switch is most often determined by external circuitry. However, the on-state forward voltage drop of this switch can determine the maximum current when external circuit impedances are very low. This forward drop approaches that for a single forward biased junction and a saturated transistor under ideal conditions. The switch remains in the conducting state until the forward current drops below the "holding" minimum and all of the free carriers in the bases recombine. The reverse blocking characteristics of this switch are the same as for the electrically triggered thyristor.

Due to the gateless structure, the entire wafer area or essentially the entire wafer area is available for the conduction of load current. Therefore, this switch uses its silicon more efficiently than its electrically triggered counterpart. Higher effective current densities (J) are possible. In the electrically gated thyristor, interdigitization of the gate structure on the cathode surface is employed to increase di/dt, at the expense of area for load current. The gateless design, using the photon trigger, eliminates the dependence of di/dt on horizontal plasma spreading, which is characteristic of the electrically-gated varieties. To increase di/dt in the photonically triggered switch, the laser power can be increased without compromising the area for conduction of load current. Combining these characteristics leads to a superior switch for high di/dt, high current and high charge transfer applications.

Fundamentally, the current handling of a given 4-layer silicon wafer 108 increases in direct proportion to its area when employing this photonic trigger scheme. It should thus be possible to carry as much as 450 kA for several milliseconds with a single switch that has a semiconductor structure with diameter of 155 mm. Such a switch can have a current rate of rise as high as 70 kA per microsecond with 2 sided laser light illumination.

As discussed above, the on-board laser triggering scheme also allows the switch assemblies 100 to be stacked in series with their triggers optically isolated. Power can be slaved from the main energy store through divider resistors. This makes these switches viable for even higher voltage applications such as Marx generators, electric guns, reactive armor etc., and, as a replacement for thyratrons in many applications.

As the cost of the laser arrays decreases, this switch becomes even more attractive for replacing existing vacuum, gas and solid state switches. Presently, costs seem to be directly related to the size of the parent wafer on which the laser arrays are made. Manufacturing yield is also a factor.

This triggering scheme can also be applied to derivatives of the basic 4-layer silicon device as well. Candidates for this triggering scheme include, but are not limited to, the following: triac, unijunction transistor (UJT), programmable unijunction transistor (PUT), reverse conducting thyristor (RCT), gate turn-off thyristor (GTO), mos-controlled thyristor (MCT and the mos-turn-off thyristor (MTO). On-board lasers or LED's may also be used to enhance the switching performance of other bipolar or unipolar semiconductor devices.

Furthermore, alternative semiconductor materials may be used for the wafer fabrication. This includes other indirect bandgap materials such as germanium, silicon carbide and gallium phosphide, and, direct bandgap materials such as selenium, gallium nitride, gallium arsenide and indium phosphide. The laser wavelength would have to be selected for the particular bandgap of the material. Some of these materials are especially well suited for switching high power, and others offer very high speed switching and may be used at microwave frequencies.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A laser activated semiconductor switching device, comprising:

a semiconductor assembly including a multi-layer semiconductor structure having first and second principal surfaces; and a first laser array assembly including at least one laser device and being directly connected to said semiconductor assembly, such that first laser light emitted from said laser device impinges directly onto said first surface to activate said semiconductor structure to enable passage of current therethrough.

2. A laser activated semiconductor switching device as claimed in claim 1 wherein first and second metal electrode layers are disposed on said first and second principal surfaces, respectively, said first metal electrode layer having an opening therein, said laser array assembly being connected to said semiconductor assembly such that said laser light passes through said opening in said first metal electrode layer.

3. A laser activated semiconductor switching device as claimed in claim 2 wherein said laser array assembly includes a surface having an opening substantially aligned with said opening in said first metal layer; and said laser device is arranged in said housing such that said light from said laser device passes through said opening in said surface of said laser array assembly before passing through said opening in said first metal layer.

4. A laser activated semiconductor switching device as claimed in claim 2 wherein said first and second metal layers are reflective to said laser light.

5. A laser activated semiconductor switching device as claimed in claim 1 wherein first and second metal electrode layers are disposed on said first and second principal surfaces, respectively, said first metal electrode layer having a thin light transparent area, said laser array assembly being connected to said semiconductor assembly such that said laser light passes through said thin light transparent area.

6. A laser activated semiconductor switching device as claimed in claim 1 wherein said laser array assembly further comprises laser activation circuitry controlling activation of said laser device.

7. A laser activated semiconductor switching device as claimed in claim 1 wherein said laser array assembly includes a housing which comprises an electrically conductive material and directs current through said semiconductor structure when said semiconductor structure is activated by said laser light.

8. A laser activated semiconductor switching device as claimed in claim 1 wherein said laser array assembly includes a housing having members defining a plurality of cells therein, with each cell receiving one laser device.

9. A laser activated semiconductor switching device as claimed in claim 1 wherein said laser device is a laser diode.

10. A laser activated semiconductor switching device as claimed in claim 1 wherein said laser device is a bar array.

11. A laser activated semiconductor switching device as claimed in claim 1 wherein said laser device is an array of lasers.

12. A laser activated semiconductor switching device as claimed in claim 1 wherein a thermoelectric device is used to adjust a temperature of said laser device to adjust the wavelength of said laser light.

13. A laser activated semiconductor switching device as claimed in claim 1 wherein said multi-layer semiconductor structure is a 4-layer, n-p-n-p structure.

14. A laser activated semiconductor switching device as claimed in claim 1 wherein said multi-layer semiconductor structure is a 2-layer p-n structure.

15. A laser activated semiconductor switching device as claimed in claim 1 wherein said multi-layer semiconductor structure is a 3-layer n-p-n or p-n-p structure.

16. A laser activated semiconductor switching device as claimed in claim 1 wherein a gate structure is mounted on one of said first and second principal surfaces of said semiconductor structure for activating said semiconductor structure to enable passage of current therethrough.

17. A laser activated semiconductor switching device as claimed in claim 1 wherein a second laser array assembly, including at least one second laser device, is directly connected to said semiconductor assembly such that laser light emitted from said second laser device impinges directly onto said second principal surface to further activate said semiconductor to enable passage of current therethrough.

18. A laser activated semiconductor switching device as claimed in claim 17 wherein first and second metal electrode layers are disposed on said first and second principal surfaces, respectively, and have first and second openings therein, respectively;

said first laser array assembly is connected to the semiconductor assembly such that said first laser light passes through said first opening; and said second laser array assembly is connected to said semiconductor assembly such that said second laser light passes through said second opening.

19. A laser activated semiconductor switching device as claimed in claim 17 wherein said first and second principal surfaces have first and second thin laser light transparent areas, respectively;

said first laser array assembly is connected to the semiconductor assembly such that said first laser light passes through said first thin laser light transparent area; and said second laser array assembly is connected to said semiconductor assembly such that said second laser light passes through said second thin laser light transparent area.

20. A method for controlling current flow to a load, comprising the steps of:

providing a current signal to a semiconductor switch assembly including a multi-layer semiconductor structure having first and second principal surfaces and a laser array assembly that is directly coupled to said first principal surface of said semicondutor structure, and including at least one first laser device; and applying an energizing signal to said first laser device to cause said first laser device to emit first laser light that impinges directly onto said first principal surface to activate said semiconductor structure to enable passage of said current signal therethrough to said load.

21. A method as claimed in claim 20 further comprising the step of removing said energizing signal from said first laser device to cause said first laser device to stop emitting said laser light, to deactivate said semiconductor structure to prevent passage of said current signal therethrough when said current signal is below a predetermined threshold.

22. A method as claimed in claim 20 further comprising the step of directing said laser light through an opening in a first metal electrode layer formed on said first principal surface.

23. A method as claimed in claim 20 further comprising the step of directing said laser light through a thin laser light transparent area of a first metal electrode layer formed on said first principal surface.

24. A method as claimed in claim 20 further comprising the step of adjusting a temperature of said laser device to adjust a wavelength of said laser light.

25. A method as claimed in claim 20 wherein said semiconductor switch assembly includes a second laser array assembly directly coupled to said second principal surface of said semicondutor structure, and includes at least one second laser device;

the method further comprising the step of applying a second energizing signal to said second laser device to cause said second laser device to emit second laser light that impinges directly onto said second principal surface to activate said semiconductor structure to enable passage of said current signal therethrough to said load.

26. A method as claimed in claim 25 further comprising the step of removing said second energizing signal from said second laser device to cause said second laser device to stop emitting said second laser light, to deactivate said semiconductor structure to prevent passage of said current signal therethrough when said current signal is below a predetermined threshold.

27. A method as claimed in claim 25 further comprising the step of directing said second laser light through an opening in a second metal electrode layer formed on said second principal surface.

28. A method as claimed in claim 25 further comprising the step of directing said second laser light through a thin laser light transparent area of a second metal electrode layer formed on said second principal surface.

* * * * *